United States Patent
Aida et al.

(10) Patent No.: US 8,845,806 B2
(45) Date of Patent: Sep. 30, 2014

(54) SHOWER PLATE HAVING DIFFERENT APERTURE DIMENSIONS AND/OR DISTRIBUTIONS

(75) Inventors: Koei Aida, Hachioji (JP); Tomoyuki Baba, Tama (JP)

(73) Assignee: ASM Japan K.K., Tokyo (JP)

( * ) Notice: Subject to any disclaimer, the term of this patent is extended or adjusted under 35 U.S.C. 154(b) by 842 days.

(21) Appl. No.: 12/910,607

(22) Filed: Oct. 22, 2010

(65) Prior Publication Data

US 2012/0100307 A1    Apr. 26, 2012

(51) Int. Cl.
| | | |
|---|---|---|
| C23C 16/455 | (2006.01) | |
| C23F 1/00 | (2006.01) | |
| H01L 21/306 | (2006.01) | |
| H01J 37/32 | (2006.01) | |
| C23C 16/503 | (2006.01) | |
| C23C 16/50 | (2006.01) | |
| C23C 16/505 | (2006.01) | |
| C23C 16/509 | (2006.01) | |

(52) U.S. Cl.
CPC ..... C23C 16/45525 (2013.01); H01J 37/32449 (2013.01); H01J 37/3244 (2013.01); C23C 16/50 (2013.01); C23C 16/45565 (2013.01)
USPC ............. 118/715; 118/723 R; 118/723 E; 156/345.33; 156/345.34; 156/345.43; 156/345.44; 156/345.45

(58) Field of Classification Search
USPC ................... 118/715; 156/345.33, 345.34
See application file for complete search history.

(56) References Cited

U.S. PATENT DOCUMENTS

| | | | | |
|---|---|---|---|---|
| 4,134,425 | A | * | 1/1979 | Gussefeld et al. ......... 137/625.3 |
| 4,780,169 | A | * | 10/1988 | Stark et al. ............... 156/345.34 |
| 4,854,263 | A | | 8/1989 | Chang et al. |
| 5,415,753 | A | * | 5/1995 | Hurwitt et al. .......... 204/192.12 |
| 5,496,408 | A | * | 3/1996 | Motoda et al. ................ 118/715 |
| 5,589,002 | A | * | 12/1996 | Su ............................. 118/723 E |
| 5,589,110 | A | * | 12/1996 | Motoda et al. ................. 261/61 |
| 5,683,517 | A | * | 11/1997 | Shan ........................ 118/723 E |
| 5,728,223 | A | | 3/1998 | Murakami et al. |
| 5,781,693 | A | * | 7/1998 | Ballance et al. .............. 392/416 |
| 5,819,434 | A | * | 10/1998 | Herchen et al. ................. 34/232 |
| 5,853,484 | A | * | 12/1998 | Jeong ............................ 118/715 |
| 5,968,275 | A | * | 10/1999 | Lee et al. .................. 118/723 R |
| 6,024,799 | A | * | 2/2000 | Chen et al. .................... 118/715 |
| 6,050,506 | A | * | 4/2000 | Guo et al. ..................... 239/558 |
| 6,086,677 | A | * | 7/2000 | Umotoy et al. ............... 118/715 |
| 6,162,323 | A | * | 12/2000 | Koshimizu ............... 156/345.26 |
| 6,250,250 | B1 | * | 6/2001 | Maishev et al. ......... 118/723 ER |
| 6,446,573 | B2 | * | 9/2002 | Hirayama et al. .... 118/723 MW |

(Continued)

FOREIGN PATENT DOCUMENTS

JP    04-115531    4/1992

*Primary Examiner* — Rudy Zervigon

(74) *Attorney, Agent, or Firm* — Snell & Wilmer L.L.P.

(57) ABSTRACT

A shower plate is adapted to be attached to the showerhead and includes a front surface adapted to face the susceptor; and a rear surface opposite to the front surface. The shower plate has multiple apertures each extending from the rear surface to the front surface for passing gas therethrough in this direction, and the shower plate has at least one quadrant section defined by radii, wherein the one quadrant section has an opening ratio of a total volume of openings of all the apertures distributed in the section to a total volume of the one quadrant section, which opening ratio is substantially smaller than an opening ratio of another quadrant section of the shower plate.

16 Claims, 7 Drawing Sheets

(56) References Cited

U.S. PATENT DOCUMENTS

| | | | |
|---|---|---|---|
| 6,454,860 B2 | 9/2002 | Metzner et al. | |
| 6,461,435 B1* | 10/2002 | Littau et al. | 118/715 |
| 6,576,062 B2* | 6/2003 | Matsuse | 118/719 |
| 6,635,117 B1* | 10/2003 | Kinnard et al. | 118/723 R |
| 6,692,575 B1* | 2/2004 | Omstead et al. | 118/728 |
| 6,872,258 B2* | 3/2005 | Park et al. | 118/715 |
| 6,872,259 B2* | 3/2005 | Strang | 118/715 |
| 7,476,291 B2* | 1/2009 | Wang et al. | 156/345.33 |
| 8,038,835 B2* | 10/2011 | Hayashi et al. | 156/345.34 |
| 8,231,799 B2* | 7/2012 | Bera et al. | 216/67 |
| 8,252,114 B2* | 8/2012 | Vukovic | 118/715 |
| 8,440,259 B2* | 5/2013 | Chiang et al. | 427/248.1 |
| 8,484,846 B2* | 7/2013 | Dhindsa | 29/890.1 |
| 2002/0088542 A1* | 7/2002 | Nishikawa et al. | 156/345.29 |
| 2003/0010452 A1* | 1/2003 | Park et al. | 156/345.33 |
| 2003/0019428 A1* | 1/2003 | Ku et al. | 118/715 |
| 2003/0019580 A1* | 1/2003 | Strang | 156/345.33 |
| 2003/0209323 A1 | 11/2003 | Yokogaki | |
| 2004/0261712 A1* | 12/2004 | Hayashi et al. | 118/723 E |
| 2005/0133161 A1* | 6/2005 | Carpenter et al. | 156/345.34 |
| 2005/0145338 A1* | 7/2005 | Park et al. | 156/345.34 |
| 2005/0255257 A1* | 11/2005 | Choi et al. | 427/585 |
| 2006/0021703 A1* | 2/2006 | Umotoy et al. | 156/345.34 |
| 2006/0236934 A1* | 10/2006 | Choi et al. | 118/723 R |
| 2007/0215048 A1* | 9/2007 | Suzuki et al. | 118/725 |
| 2007/0218200 A1* | 9/2007 | Suzuki et al. | 427/248.1 |
| 2007/0234955 A1* | 10/2007 | Suzuki et al. | 118/715 |
| 2008/0178805 A1* | 7/2008 | Paterson et al. | 118/723.1 |
| 2008/0302303 A1* | 12/2008 | Choi et al. | 118/723 R |
| 2008/0305246 A1* | 12/2008 | Choi et al. | 427/74 |
| 2009/0000551 A1* | 1/2009 | Choi et al. | 118/723 R |
| 2009/0246374 A1* | 10/2009 | Vukovic | 427/255.28 |
| 2010/0006031 A1* | 1/2010 | Choi et al. | 118/723 R |
| 2010/0136216 A1* | 6/2010 | Tsuei et al. | 427/9 |
| 2010/0243166 A1* | 9/2010 | Hayashi | 156/345.34 |
| 2012/0103264 A1* | 5/2012 | Choi et al. | 118/728 |
| 2012/0135145 A1* | 5/2012 | Je et al. | 427/248.1 |

* cited by examiner

SHOWER PLATE HAVING DIFFERENT APERTURE DIMENSIONS AND/OR DISTRIBUTIONS

BACKGROUND

1. Field of the Invention

The present invention generally relates to a plasma deposition apparatus used in a semiconductor manufacturing process; particularly to a shower plate provided in the apparatus.

2. Description of the Related Art

A conventional plasma CVD apparatus possesses a first and a second electrode disposed parallel to each other inside a vacuum chamber; the first electrode has a hollow structure for introducing source gases into the vacuum chamber and has a shower plate removably attached in its bottom face; in the shower plate, many gas outlet holes or apertures are formed.

A conventional shower plate is disk-shaped and has many gas outlet apertures (e.g., 3,000 to 5,000) of a given diameter being formed in an arrangement adapted to pass completely through to the reverse face of the shower plate from its front face. Additionally, in the conventional shower plate, apertures are symmetrically distributed along its axis typically in a honeycomb-shaped surface pattern.

However, conventional plasma CVD apparatuses have a problem in that it is difficult to form a thin film having desired properties stably with excellent controllability or reproducibility. That is, the operable ranges to produce desired films are narrow.

SUMMARY

Further, the present inventors recognize the following problems in conventional plasma CVD apparatus. In order to create uniform plasma in a reaction chamber, it is ideal that an inner wall of the reaction chamber form a perfect cylinder. However, since the reaction chamber is equipped necessarily with a wafer transfer gate, a view port, etc., the inner wall of the reaction chamber cannot form a shape of a perfect cylinder and intrinsically forms a partially irregular shape. At such irregularly shaped portions, due to the irregularity, a plasma is partially diffused and becomes non-uniform along a plane parallel to the front surface of the shower plate, thereby affecting film thickness and film properties.

In an embodiment of the present invention, a plasma enhanced deposition apparatus, which is able to form a thin film having uniform properties, is provided. In an embodiment, a film having high in-plane uniformity can be formed by accommodating irregularities formed at or on an inner surface of the reaction chamber, relative to a perfectly cylindrical inner surface. In an embodiment, it can be achieved by using a specifically designed shower plate.

When gas flow is within a range of controllability of film deposition, and pressure inside the reaction chamber is constant, the longer the residence time of the gas over a substrate, the greater the thickness of depositing film becomes. By reducing gas flow rate, the residence time of gas can be prolonged. Thus, in an embodiment, by employing the following two methods, the residence time of gas can be prolonged or adjusted locally over a selected area or areas of the substrate where the thickness of film is to be increased so as to increase in-plane uniformity:

(1) the size of the apertures within a selected position or positions of the shower plate is made smaller than that of other apertures, thereby increasing gas flow resistance or decreasing conductance of gas flow locally in the selected area(s), so as to compensate for localized plasma diffusion due to the irregularity of the inner surface of the reaction chamber; and/or (2) the density of the apertures within a selected position or positions of the shower plate is made lower than that of other apertures, thereby increasing gas flow resistance or decreasing conductance of gas flow locally in the selected area(s), so as to compensate for localized plasma diffusion due to the irregularity of the inner surface of the reaction chamber.

The selected area(s) of the shower plate can be determined in accordance with the plasma distribution over the substrate, i.e., the film thickness distribution of the film deposited on the substrate. The plasma diffusion occurs due to the irregularity of the inner surface of the reaction chamber relative to a perfect cylinder, and thus, the selected area(s) may not be defined by a radial area (i.e., an area not defined by radii) nor by a geographically defined area, but may be defined by an irregularly defined area or asymmetrically defined area.

An embodiment provides a shower plate adapted to be installed in a plasma deposition apparatus comprising a reaction chamber with a gate valve, a showerhead, and a susceptor, said shower plate being adapted to be attached to the showerhead and comprising: (i) a front surface adapted to face the susceptor; and (ii) a rear surface opposite to the front surface, wherein the shower plate has multiple apertures each extending from the rear surface to the front surface for passing gas therethrough in this direction, and the shower plate has at least one quadrant section defined by radii, wherein the one quadrant section has an opening ratio of a total volume of openings of all the apertures distributed in the one quadrant section to a total volume of the one quadrant section, said opening ratio being substantially smaller than an opening ratio of another quadrant section of the shower plate.

Another embodiment provides a plasma deposition apparatus comprising: (a) a reaction chamber having a gate valve; (b) a showerhead to which the foregoing shower plate is attached; and (c) a susceptor.

Still another embodiment provides a method for forming a film on a substrate using the foregoing plasma deposition apparatus, comprising: (A) introducing gas through the shower plate toward the substrate, wherein the one quadrant section is positioned in a vicinity of the gate valve, wherein gas flow through the apertures in the one quadrant section is less than that through those in the another quadrant section; and (B) applying RF power to deposit a film on the substrate.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DESCRIPTION OF EMBODIMENTS

As described above, in an aspect, an embodiment provides a shower plate having multiple apertures each extending from the rear surface to the front surface for passing gas therethrough in this direction, wherein the shower plate has at least one quadrant section defined by radii, and the one quadrant section has an opening ratio of a total volume of openings of all the apertures distributed in the one quadrant section to a total volume of the one quadrant section, said opening ratio being substantially smaller than an opening ratio of another quadrant section of the shower plate. In this disclosure, "an opening ratio" in a section is defined by a ratio of a total volume of openings of all the apertures distributed in the section to a total volume of the section. The opening ratio can be adjusted by changing the aperture size, the aperture shape, and/or the density of the apertures.

Another embodiment provides a shower plate having multiple apertures each extending from the rear surface to the front surface for passing gas therethrough in this direction, and the shower plate has at least one region disposed asymmetrically with respect to its axis as viewed from the front, said at least one region having an opening ratio of a total volume of openings of all the apertures distributed in the region to a total volume of the region, which opening ratio is substantially smaller than an opening ratio of other regions of the shower plate.

In the disclosure, "substantially smaller", "substantially different", or "substantially less" refers to a difference of at least 1%, 5%, 10%, 20%, 30%, 40%, 50%, 60%, 70%, 80%, or any ranges thereof, for example. Also, in the disclosure, "substantially the same" or "substantially uniform" refers to a difference of less than 10%, less than 5%, less than 1%, or any ranges thereof, for example.

The shower plate is adapted to be installed in a plasma deposition apparatus. In some embodiments, the plasma deposition apparatus may be a plasma enhanced CVD apparatus, plasma enhanced ALD apparatus, high density plasma CVD apparatus, or any other suitable apparatuses equipped with a shower plate and a susceptor disposed in parallel to each other, wherein the shower plate and the susceptor are capacitively coupled and function as an upper electrode and a lower electrode for plasma processing. In some embodiments, the plasma deposition apparatus is a plasma enhanced CVD (PECVD) apparatus including a pulsed PECVD apparatus.

Figure 7:
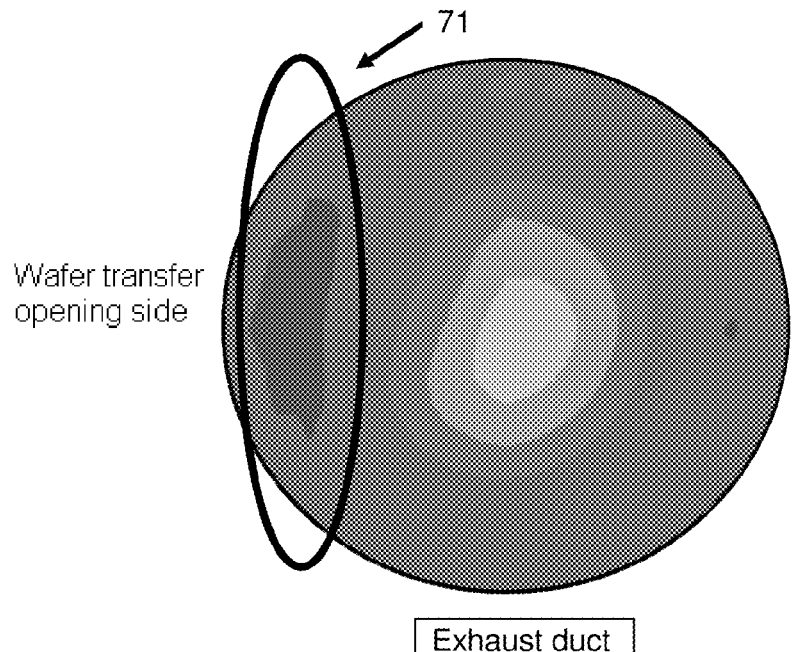
FIG. 7 is a film thickness profile of a film deposited on a wafer using a conventional shower plate.

In some embodiments, an opening ratio of a total volume of openings of all the apertures distributed in a selected area of the shower plate to a total volume of the selected area is reduced, wherein the selected area includes an area of the front surface of the shower plate directly above an area of a film deposited on a substrate where a film thickness is low relative to that in other portions of the film. The selected area may include an area defined by projecting a thin-film area of a wafer on the front surface of the shower plate or an area of diffused plasma caused by the irregularity of the inner surface of the reaction chamber, wherein the film thickness under the selected area of the shower plate is lower (in-plane uniformity is lowered) due to plasma diffusion in the area. The thin film area can be identified by any suitable methods using a conventional film thickness profile measuring device as shown in FIG. 7. In FIG. 7, the circle represents a wafer placed in a reaction chamber as viewed from above. A thin-film area corresponds to an area darker than other areas where a film deposited on the wafer is thinner in the darker area than the other areas. In FIG. 7, the thin-film area is found within an encircled area 71 in the vicinity of a wafer transfer opening side.

In some embodiments, the selected area may be defined by quadrisecting the shower plate, or by any two radii of the shower plate and an angle formed by the radii at its axis, or by an area disposed symmetrically with respect to its axis.

Figure 5A:
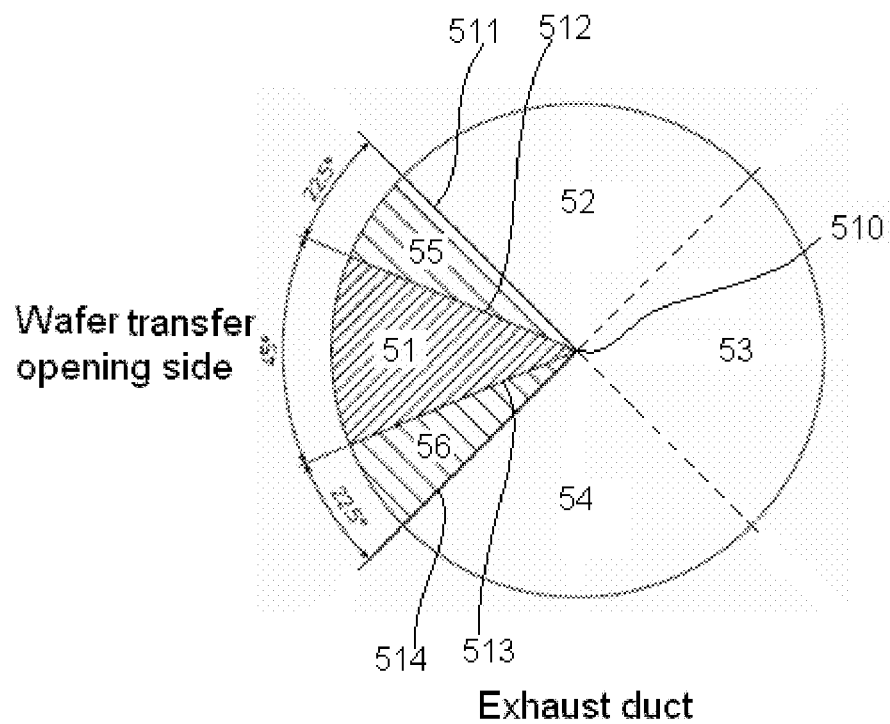
FIG. 5A is a schematic front view of a shower plate according to an embodiment of the present invention.

FIG. 5A illustrates an embodiment where a selected region 51 is defined by radii 512 and 513 and has an angle of 45° at its axis 510. The selected area is indicated and oversimplified by hatching, simply referring to an area where the opening ratio is different from the other areas, rather than referring to any particular shape, size, density, or distribution of apertures in the area in this figure. The above applies to the selected areas shown also in FIGS. 6 and 9 described later. In this embodiment, there are two secondary selected areas 55 and 56, disposed next to the selected area 51. The area 55 is defined by radii 512 and 511 and has an angle of 22.5° at its axis 510, and the area 56 is defined by radii 513 and 514 and has an angle of 22.5° at its axis 510. The selected area 51 has a first opening ratio, the secondary selected areas 55 and 56 have a second opening ratio, and the remaining three quadrants 52 to 54 have a third opening ratio, wherein the first opening ratio is smaller than the second opening ratio which is smaller than the third opening ratio. The selected area 51 is disposed in the vicinity of a wafer transfer opening side. The shower plate can be divided differently, and can have one or more secondary selected areas disposed next to each of the secondary selected areas 53 and 54. If an exhaust duct affects plasma distribution, the selected areas 51, 55, and 56 can be disposed closer to the exhaust duct to compensate for plasma diffusion, by rotating the shower plate counterclockwise (e.g., rotating by 5° to 60°) as viewed from above. In some embodiments, a selected area can be smaller than the selected area 51, e.g., a segment of the selected area 51 further defined by two circumferences (a portion of a ring shape).

Figure 6:
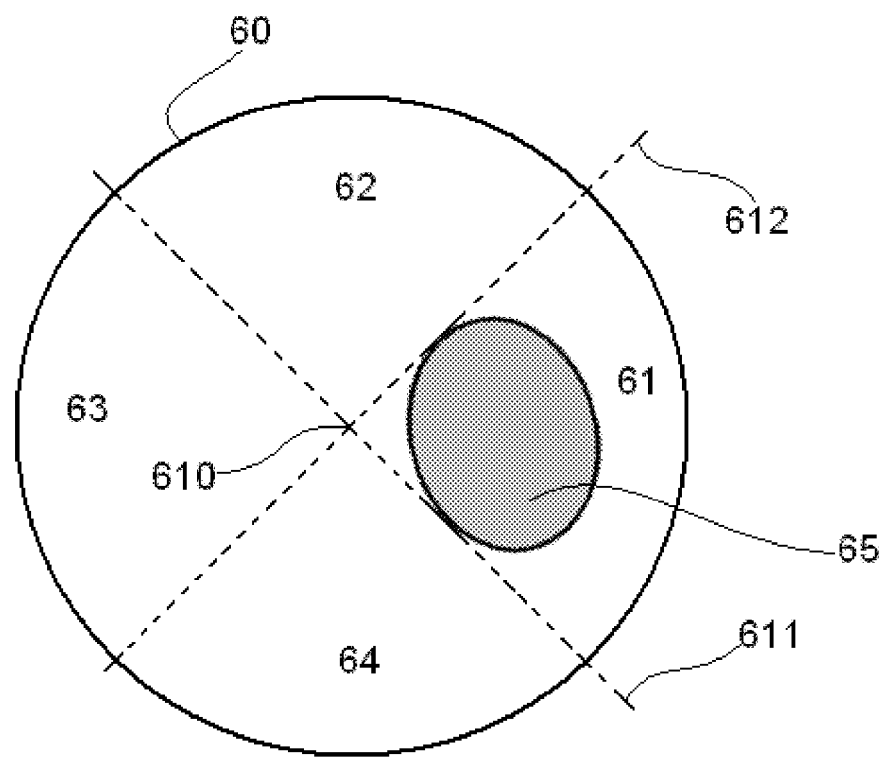
FIG. 6 is a schematic front view of a shower plate according to another embodiment of the present invention.

FIG. 6 illustrates another embodiment wherein a shower plate 60 includes a selected area 65 disposed asymmetrically with respect to its axis 610. The selected area 65 is included in a quadrant 61 defined by radii 611 and 612. Thus, the quadrant 61 can also be referred to as a selected area. The opening ratio of the selected area 65 is smaller than that of the remaining area of the quadrant 61 and that of the other quadrants 62 to 64. Also, the opening ratio of the quadrant 61 is smaller than that of the other quadrants 62 to 64. In some embodiments, two or more discrete areas (such as the area 65) of substantially the same size or different sizes can be disposed in one quadrant or a specific selected area.

Figure 9:
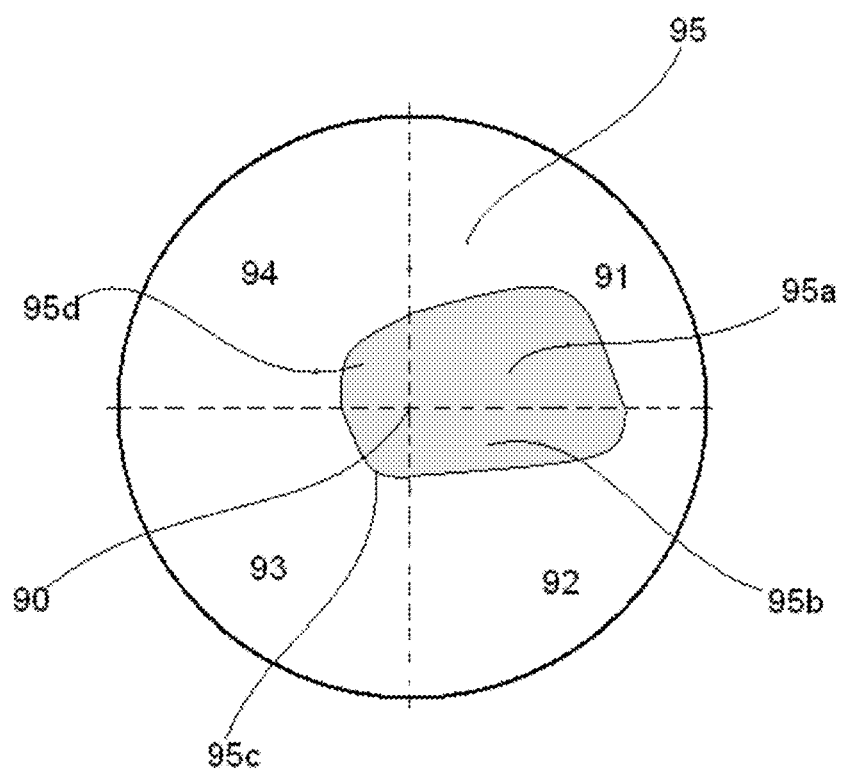
FIG. 9 is a schematic front view of a shower plate according to another embodiment of the present invention.

FIG. 9 illustrates still another embodiment where a selected area 95 is disposed asymmetrically with respect to its axis 90. The selected area 95 is extended asymmetrically around its axis 90 and included in each of quadrants 91, 92, 93, and 94. That is, the selected area 95 consists of sub-areas 95a, 95b, 95c, and 95d, which are included in the quadrants 91, 92, 93, and 94, respectively. Since an area of the sub-area 95a is greater than that of the other sub-areas 95b, 95c, and 95d, the opening ratio of the quadrant 91 is smaller than that of the quadrants 92 to 94, and thus, the quadrant 91 can also be referred to as a selected area.

A skilled artisan would be readily able to modify the above embodiments and determine a location of the selected area, depending on the location of the thin-film area or area of plasma diffusion, based on this disclosure.

Figure 2:
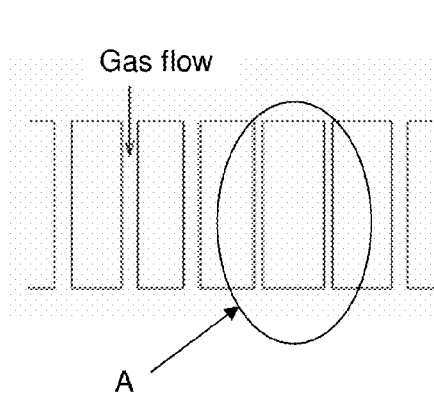
FIG. 2 is a schematic cross sectional partial view of a shower plate according to an embodiment of the present invention.
Figure 3:
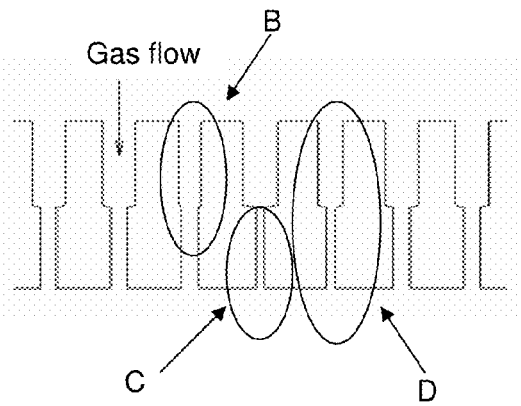
FIG. 3 is a schematic cross sectional partial view of a shower plate according to other embodiments of the present invention.

By reducing the opening ratio of the selected area of the shower plate, gas flow in the selected area can be reduced, thereby increasing the film thickness in the area corresponding to the selected area. One method of reducing the opening ratio is reducing an aperture size. FIG. 2 is a schematic cross sectional partial view of a shower plate and illustrates an embodiment wherein the aperture is of a straight type, and has a narrower pore size (e.g., 0.3 to 2 mm) as shown in a circle A (aperture A). FIG. 3 is a schematic cross sectional partial view of a shower plate and illustrates embodiments wherein the aperture has a step, i.e., the opening on the rear surface (inlet side) is larger than that on the front surface (outlet side). The aperture in a circle B (aperture B) has a smaller opening (e.g., 0.5 to 3 mm) on the inlet side relative to the other apertures, the aperture in a circle C (aperture C) has a smaller opening (e.g., 0.3 to 2 mm) on the outlet side relative to the other apertures, and the aperture in a circle D (aperture D) has a smaller opening on both inlet and outlet sides relative to the other apertures. For the purposes of lowering gas flow, apertures A, C, and D are better than aperture B. Between apertures A and C, since bores narrower than others need to be formed throughout the selected area of the shower plate, aperture C is more advantageous in term of productivity and easy production. Between apertures C and D, since both inlet and outlet sides need to be processed differently from others, aperture C is more advantageous in terms of productivity and easy production. In view of the above, in some embodiments, aperture C is used.

Figure 4:
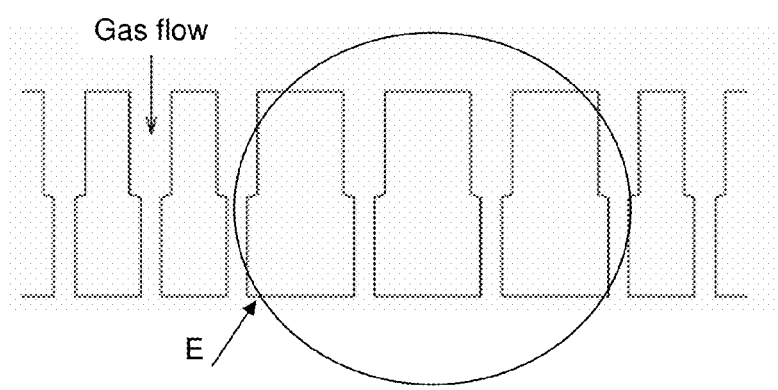
FIG. 4 is a schematic cross sectional partial view of a shower plate according to another embodiment of the present invention.

Another method of reducing the opening ratio is reducing a density of apertures. FIG. 4 is a schematic cross sectional partial view of a shower plate and illustrates an embodiment wherein the density of apertures is lowered (e.g., 2 to 9.9 holes/cm$^2$) as shown in a circle E (aperture E). Typically, the density of apertures (e.g., about 3,000 to about 5,000) may be 3 to 10 holes/cm$^2$. Between apertures C and E, since in-plane uniformity is likely to suffer in a less dense area in aperture E, aperture C may be preferable in some embodiments.

Returning to FIG. 5A as an embodiment, the selected area 51 is an area where aperture A, B, C, D, and/or E (any two or more combinations can be used) are presented. For example, aperture C is used in the selected area 51. In some embodiments, the film on a substrate may be thinner in a portion in a vicinity of a wafer transfer opening side than in other portions, and the closer the distance to the wafer transfer opening side, the thinner the film may become. Thus, it is preferable in some embodiments to define the selected area by radii (a wedge shape) with an angle of about 45° at its axis. In the selected area, about 5% to about 40% of all the apertures are apertures C (i.e., the opening only at the outlet side is smaller than that of other apertures in the selected area) which are uniformly distributed in the selected area. In some embodiments, the secondary selected areas 55 and 56 are further disposed next to the selected area 51, each being defined by radii with an angle of about 22.5° at its axis, In some embodiments, in the secondary selected areas 55 and 56, about 3% to about 20% of all the apertures, but less than that in the selected area 51, are apertures C which are uniformly distributed in the selected area. FIG. 5C illustrates an example of the above embodiment wherein each unshaded square of a grid represents a circular a aperture having a first diameter, and each shaded square of the grid represents a circular aperture having a second diameter smaller than the first diameter.

Figure 5B:
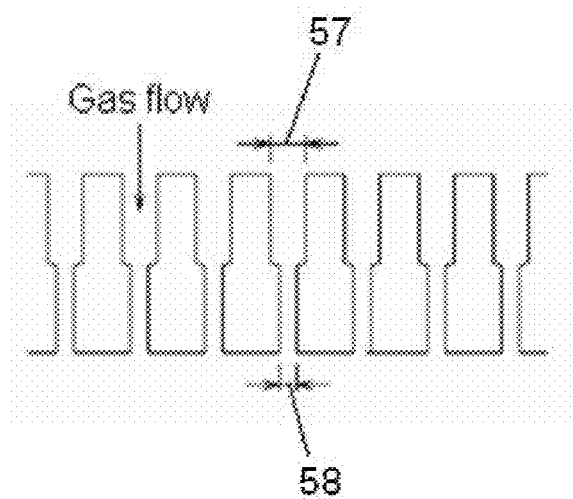
FIG. 5B is a schematic cross sectional partial view of the shower plate according to an embodiment of the present invention.
Figure 5C:
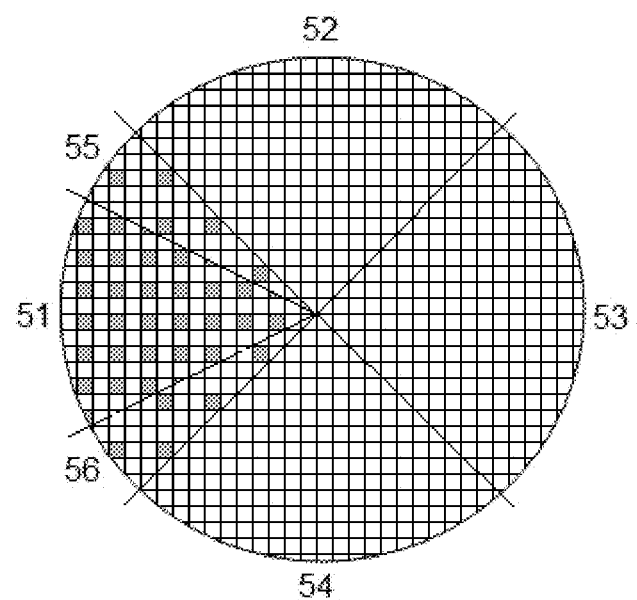
FIG. 5C is a schematic front view of the shower plate according to an embodiment of the present invention wherein each unshaded square of a grid represents a circular aperture having a first diameter, each shaded square of the grid represents a circular aperture having a second diameter smaller than the first diameter.

In some embodiments, the opening 57 at the inlet side of all the apertures throughout the rear surface of the shower plate as shown in FIG. 5B is about 1 mm in diameter, and the opening 58 at the outlet side of the apertures other than apertures C throughout the front surface of the shower plate as shown in FIG. 5B is about 0.5 mm in diameter, whereas the opening 58 of the apertures C in the selected area 51 is about 0.45 mm in diameter.

In some embodiments, the shower plate has a thickness of 3 to 30 mm, and a diameter of 300 to 450 mm, and is made of aluminum, surface-anodized aluminum, aluminum alloy, ceramics, etc. In some embodiments, the shower plate may have about 1,000 to about 10,000 apertures or about 3,000 to about 5,000, and the apertures other than those in the selected area are uniformly or geographically distributed throughout the surface except for an area close to the outer periphery or central area or area around lift pin holes. In some embodiments, the apertures other than those in the selected area are distributed randomly or concentrically uniformly but radially differently. In some embodiments, the apertures other than those in the selected area are distributed in a honey-comb pattern, lattice pattern, radial pattern, and/or concentric pattern. In some embodiments, the apertures in the selected area are distributed in the same manner as the other apertures (as described above) in the other areas.

The disclosed embodiments include, but are not limited to, the following.

In some embodiments, the one quadrant section includes smaller-front opening apertures, each having a front opening substantially smaller than that of larger-front opening apertures in the region on the front surface. The another quadrant section may have apertures, each having a front opening which has substantially the same size as that of the larger-front opening apertures in the one quadrant section. Each smaller-front opening aperture and each larger-front opening aperture in the one quadrant section may have a rear opening on the rear surface, each rear opening having substantially the same size which is substantially the same as that of the front openings of the larger-front opening apertures in the one quadrant section.

In some embodiments, the one quadrant section has a density of the apertures which is substantially the same as that of the apertures in the another quadrant section. The smaller-front opening apertures may be substantially uniformly distributed throughout the one quadrant section.

In some embodiments, the one quadrant section has a density of the apertures which is substantially lower than that of the apertures in the another quadrant section. All the apertures in the one and another quadrant sections may have substantially the same shape.

In some embodiments, the smaller-front opening apertures are locally distributed in an area of the one quadrant section which area is substantially smaller than the one quadrant section.

In some embodiments, the one quadrant section includes an area where a density of the apertures distributed therein is substantially lower than that of the apertures distributed outside the area of the one quadrant section and in the another quadrant section.

In some embodiments, 5% to 40% (e.g., 10%, 20%, 30%, and any ranges thereof) of all the apertures in the one quadrant section are the smaller-front opening apertures. In some embodiments, the at least one quadrant region includes a first region defined by radii, and an angle at the center defined by the radii is in a range of 30° to 120° (e.g., 40°, 60°, 80°, 100°, and any ranges thereof), wherein the first region has a first opening ratio of a total volume of openings of all the apertures distributed in the first region to a total volume of the first region, said first opening ratio being smaller than an opening ratio of the another quadrant region.

In some embodiments, the at least one quadrant section includes a first, second and third regions, as viewed from the front, defined by lines each extending from the center of the shower plate to an outer periphery of the shower plate, the second and third regions being disposed next to the first region, respectively, and the first, second, and third regions have a first, second, and third opening ratios of a total volume of openings of all the apertures distributed in the respective regions to a total volume of the respective regions, wherein the second and third opening ratios are smaller than the opening ratio of the another quadrant section but greater than the first opening ratio. The first, second, and third regions may include smaller-front opening apertures, each having a front opening substantially smaller than that of larger-front opening apertures in the first, second, and third regions on the front surface, wherein the percentage of the smaller apertures relative to all the apertures in the second and third regions is substantially lower than that in the first region. 5% to 40% (e.g., 10%, 20%, 30%, and any ranges thereof) of all the apertures in the first region may be the smaller-front opening apertures, and 3% to 20% (e.g., 5%, 10%, 15%, and any ranges thereof) of all the apertures in the second and third regions may be the smaller-front opening apertures. The first region may be defined by radii, and an angle at the center defined by the radii may be in a range of 30° to 90° (e.g., 40°, 50°, 60°, 70°, 80°, and any ranges thereof), and wherein each of the second and third regions is defined by radii, and an angle at the center defined by the radii is in a range of 10° to 45° (e.g., 15°, 25°, 35°, and any ranges thereof).

In some embodiments, the shower plate has the first region at a position where the first region is disposed in a vicinity of the gate valve when the shower plate is attached to the showerhead.

In some embodiments, the position of the first region is also in a vicinity of the exhaust duct when the shower plate is attached to the showerhead.

In some embodiments, a plasma CVD apparatus comprises: a reaction chamber having a gate valve and an exhaust duct; a showerhead to which any of the disclosed shower plates is attached; and a susceptor.

In some embodiments, a method for forming a film on a substrate using any of the disclosed plasma CVD apparatuses, comprises: introducing gas through the shower plate toward the substrate, wherein the one quadrant section is positioned in a vicinity of the gate valve, wherein gas flow through the apertures in the one quadrant section is less than that through those in the another quadrant section; and applying RF power to deposit a film on the substrate.

In the present disclosure where conditions and/or structures are not specified, the skilled artisan in the art can readily provide such conditions and/or structures, in view of the present disclosure, as a matter of routine experimentation. Also, in the present disclosure, the numerical values applied in specific embodiments can be modified by a range of at least ±50% in other embodiments, and the ranges applied in embodiments may include or exclude the endpoints.

EXAMPLE

An embodiment of the present invention will be explained with reference to the following example which is not intended to limit the present invention.

Figure 1:
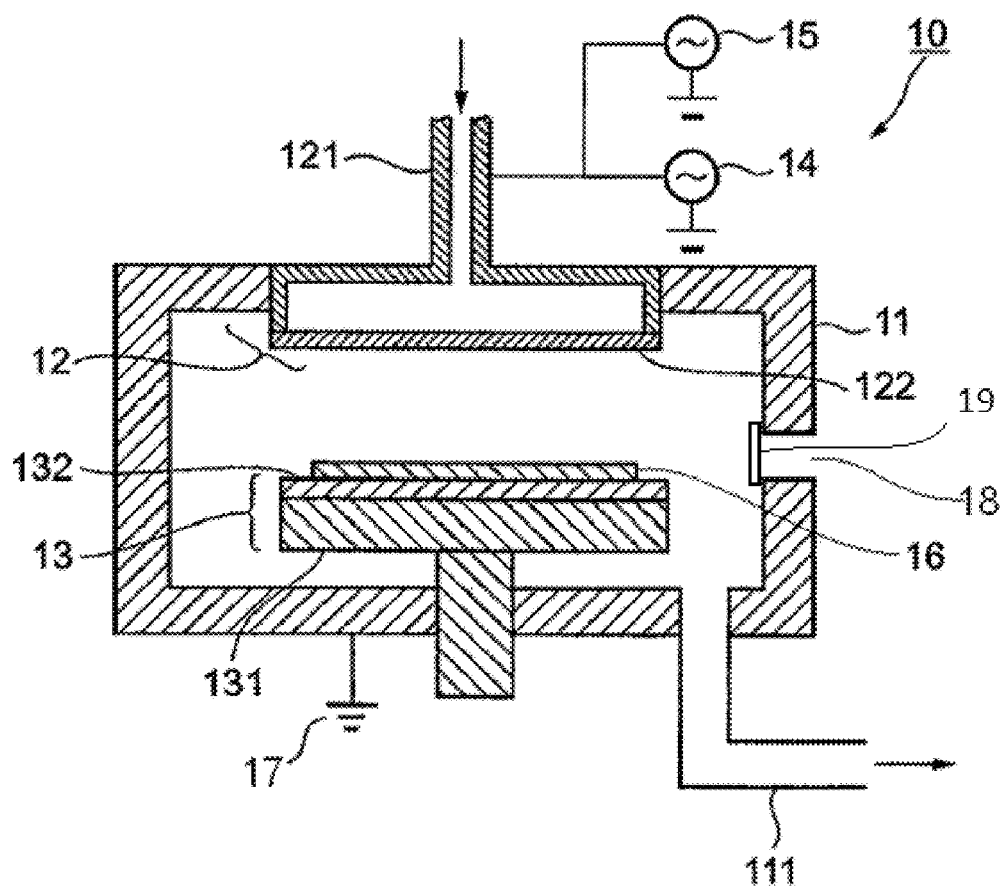
FIG. 1 is a schematic view of a plasma CVD apparatus showing a basic structure according to an embodiment of the present invention.

FIG. 1 shows a schematic view of one embodiment of the plasma CVD apparatus according to the present invention. This plasma CVD apparatus 10 comprises a vacuum (reaction) chamber 11, a first electrode 12 (showerhead) being provided at the top of the vacuum chamber 11 and insulated from the vacuum chamber 11, a second electrode 13 (susceptor) being provided inside the vacuum chamber 11 substantially parallel to the first electrode 12, and RF power sources 14 and 15 connected to the first electrode.

The vacuum chamber 11 has an opening at its lower portion and comprises an exhaust port 111 (exhaust duct) connected to an exhaust pump not shown. Additionally, the vacuum chamber 11 is grounded. The vacuum chamber 11 also has an opening 18 with a gate valve 19 on an inner side wall for wafer transfer.

The first electrode 12 has a hollow structure, and an upper tubular portion comprises a gas inlet port 121 connected to a gas line (not shown). Additionally, on a bottom face of the first electrode, a shower plate 122 is removably attached. In the shower plate 122, many gas outlet apertures (pores) as illustrated in FIGS. 5A and 5B are formed so that a jet of a source gas introduced from the gas inlet port 121 is emitted from the apertures toward the second electrode 13. By removably attaching the shower plate 122, maintenance becomes easier and part replacement-related costs can be curtailed.

The second electrode 13 has a heater 131 and a susceptor 132 provided thereon. The susceptor 132 is disposed substantially parallel to the shower plate 122 and holds a workpiece 16 placed on its upper surface.

A method for forming a thin film on a workpiece using the plasma CVD apparatus shown in FIG. 1 is described in detail below, although the present invention is not limited thereto. First, a conventional shower plate having apertures without the selected area was used to deposit a film on a workpiece, and subsequently the shower plate was replaced with the one illustrated in FIGS. 5A and 5B, and the same processes were conducted.

The workpiece 16 was placed on the susceptor 132. The inside of the vacuum chamber 11 was evacuated to a given pressure (550 Pa; typically 100 to 1,000 Pa) by an exhaust pump connected to the exhaust port 111.

The workpiece was heated to a given temperature (300° C.; typically 150-450° C.) by the heater 131, and was kept at the given temperature.

A source gas (methylsilane type gas; typically DMDMOS) was introduced from the gas inlet port 112 into the vacuum chamber 11, and at the same time, RF voltage (27.12 MHz, 1,500 W; typically 300 to 3,000 W; 400 MHz, 100 W; typically 10 to 500 W) was applied to the first electrode 12 using the RF power source 14 (if necessary, RF voltage from the second RF power source 15, lower frequency, is applied to the first electrode 12 by overlaying it on the other). The second electrode 13 was grounded, or a given bias voltage was applied. As a result, discharge occurred between the first electrode 12 and the second electrode 13, and the source gas converted to a plasma state. Thus, a plasma reaction field was formed in the vicinity of the workpiece 16, and a thin film was formed on a surface of the workpiece 16.

A type and properties of a thin film formed on the surface of the workpiece 16 can vary depending on a type and flow rate of a source gas, a temperature of a workpiece, a frequency and swing of RF voltage supplied from RF power sources 14 and 15, plasma spatial distribution and electric potential distribution.

Figure 8:
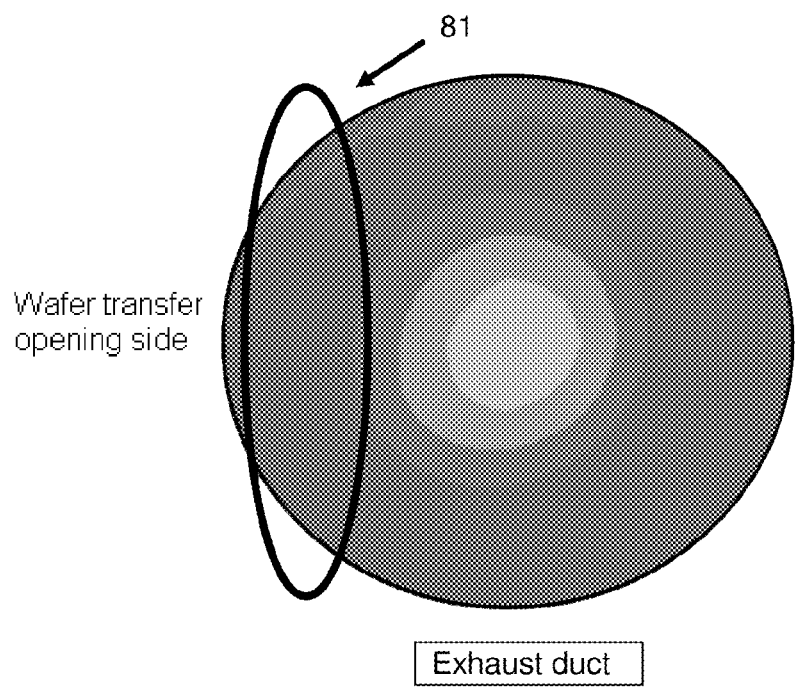
FIG. 8 is a film thickness profile of a film deposited on a wafer using a shower plate according to an embodiment of the present invention.

FIG. 7 is a film thickness profile, illustrating that in-plane uniformity of a film deposited on a workpiece was 5.5%, and an area in an encircled area 71 in the vicinity of the wafer transfer opening side had a film thinner than in other areas. Without being limited by the theory, it is believed that because the inner surface of the reaction chamber was not a perfect cylindrical shape due to a gate valve provided at the wafer transfer opening, a plasma was diffused at the irregular inner surface, thereby lowering a deposition rate in the area. FIG. 8 is a film thickness profile In contrast, as can clearly be seen from FIG. 8, by using the shower plate having tailored density and/or size of apertures corresponding to the thin-film area or area of diffused plasma, in-plane uniformity of a film deposited on a wafer was improved to 2.8%, and the thin-film area in the area in an encircled area 81 disappeared, improving in-plane uniformity of film thickness.

If it is shown that a plasma is defused by an irregularity due to a structure at the exhaust duct, the position of the selected area of the shower plate can be modified accordingly to compensate for the plasma diffusion, by rotating the shower plate counterclockwise. Normally, the shower plate has a marking structure so as to fit in place in the showerhead, and thus, it is understood or recognized which side is the wafer transfer opening side, and the location of the selected area can be recognized or determined relative to the wafer transfer opening side, for example. In some embodiments, there is no marking structure, and thus, it is possible to rotate the shower plate as needed. Further, if it is shown that a plasma is diffused by an irregularity due to any structures within the reaction chamber, the position of the selected area, the density and/or size of the apertures in the selected area can be modified accordingly to accommodate for the plasma diffusion.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A shower plate adapted to be installed in a plasma deposition apparatus comprising a reaction chamber with a gate valve, a showerhead, and a susceptor, said shower plate being adapted to be attached to the showerhead and said shower plate comprising:

a front surface adapted to face the susceptor; and
a rear surface opposite to the front surface,
wherein the shower plate has multiple apertures each extending from the rear surface to the front surface for passing gas therethrough in this direction, and
the shower plate has at least one quadrant section defined by radii, wherein the one quadrant section has an opening ratio of a total volume of openings of all the apertures distributed in the one quadrant section to a total volume of the one quadrant section, said opening ratio being substantially smaller than an opening ratio of any other quadrant section of the shower plate,
wherein the at least one quadrant section includes a first, second and third regions, as viewed from the front, defined by lines each extending from the center of the shower plate to an outer periphery of the shower plate, the first region being disposed rotationally asymmetrically, the second and third regions being smaller than and disposed next to the first region, respectively, and
the first, second, and third regions have a first, second, and third opening ratios of a total volume of openings of all the apertures distributed in the respective regions to a total volume of the respective regions, wherein the second and third opening ratios are each smaller than the opening ratio of the any other quadrant section but are each greater than the first opening ratio.

2. The shower plate according to claim 1, wherein the one quadrant section includes smaller-front opening apertures, each having a front opening smaller than that of larger-front opening apertures in the region on the front surface.

3. The shower plate according to claim 2, wherein the any other quadrant section has apertures, each having a front opening which has substantially the same size as that of the larger-front opening apertures in the one quadrant section.

4. The shower plate according to claim 2, wherein each smaller-front opening aperture and each larger-front opening aperture in the one quadrant section has a rear opening on the rear surface, each rear opening having substantially the same size which is substantially the same as that of the front openings of the larger-front opening apertures in the one quadrant section.

5. The shower plate according to claim 2, wherein the one quadrant section has a density of the apertures which is substantially the same as that of the apertures in the any other quadrant section.

6. The shower plate according to claim 5, wherein the smaller-front opening apertures are substantially uniformly distributed. throughout the one quadrant section.

7. The shower plate according to claim 1, wherein the one quadrant section has a density of the apertures which is lower than that of the apertures in the any other quadrant section.

8. The shower plate according to claim 7, wherein all the apertures in the one and any other quadrant sections have substantially the same shape.

9. The shower plate according to claim 2, wherein the smaller-front opening apertures are locally distributed in an area of the one quadrant section, which area is smaller than the one quadrant section.

10. The shower plate according to claim 1, wherein the one quadrant section includes an area where a density of the apertures distributed therein is lower than that of the apertures distributed outside the area of the one quadrant section and in the any other quadrant section.

11. The shower plate according to claim 3, wherein 5% to 40% of all the apertures in the one quadrant section are the smaller front opening apertures.

12. The shower plate according to claim 1, wherein the first, second, and third regions include smaller-front opening apertures, each having a front opening smaller than that of larger-front opening apertures in the first, second, and third regions on the front surface, wherein the percentage of the smaller apertures relative to all the apertures in the second and third regions is lower than that in the first region.

13. The shower plate according to claim 12, wherein 5% to 40% of all the apertures in the first region are the smaller-front opening apertures, and 3% to 20% of all the apertures in the second and third regions are the smaller-front opening apertures.

14. The shower plate according to claim 1, wherein the first region is defined by radii, and an angle at the center defined by the radii is in a range of 30° to 90°, and wherein each of the second and third regions is defined by radii, and an angle at the center defined by the radii is in a range of 10° to 45°.

15. A plasma deposition apparatus comprising:
 a reaction chamber having a gate valve;
 a showerhead to which the shower plate of claim 1 is attached; and
 a susceptor.

16. The shower plate according to claim 1, wherein the openings of each region are distributed uniformly through the region.

* * * * *